(12) United States Patent
Yang

(10) Patent No.: US 8,723,058 B2
(45) Date of Patent: May 13, 2014

(54) MOUNTING APPARATUS AND ELECTRONIC DEVICE ENCLOSURE WITH THE SAME

(71) Applicant: Xu Yang, Shenzhen (CN)

(72) Inventor: Xu Yang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/632,406

(22) Filed: Oct. 1, 2012

(65) Prior Publication Data

US 2013/0228369 A1    Sep. 5, 2013

(30) Foreign Application Priority Data

Mar. 2, 2012   (CN) .......................... 2012 1 0052214

(51) Int. Cl.
*H05K 7/14* (2006.01)

(52) U.S. Cl.
USPC ............................ 174/543; 312/215; 292/137

(58) Field of Classification Search
USPC ................. 174/543; 312/215, 249.7; 292/137
See application file for complete search history.

(56) References Cited

U.S. PATENT DOCUMENTS

| 5,136,463 A * | 8/1992 | Webster ..................... 361/622 |
| 6,118,071 A * | 9/2000 | Munch et al. ................ 174/51 |
| 6,457,278 B1 * | 10/2002 | Fleming ...................... 52/37 |
| 7,909,419 B2 * | 3/2011 | Vinke .......................... 312/215 |
| 8,579,338 B1 * | 11/2013 | Shah ............................. 292/145 |
| 2004/0207299 A1 * | 10/2004 | Diggle et al. ................ 312/283 |
| 2005/0017607 A1 * | 1/2005 | Weinberger ................ 312/215 |
| 2008/0218040 A1 * | 9/2008 | Punzel et al. ................ 312/128 |
| 2009/0091220 A1 * | 4/2009 | Eyer et al. .................... 312/215 |

* cited by examiner

*Primary Examiner* — Hung Ngo
(74) *Attorney, Agent, or Firm* — Novak Druce Connolly Bove + Quigg LLP

(57) ABSTRACT

A mounting apparatus is secured to a front wall of an enclosure. A door is rotatably attached to the front wall. The front wall includes a first securing portion and a second securing portion. The mounting apparatus includes a sliding rail for being attached to the front wall and a mounting member slidably attached to the sliding rail. The mounting member includes a mounting portion for engaged with the first securing portion or the second securing portion. When the mounting portion is engaged with the first securing portion, the mounting member is engaged with the door, for preventing the door from rotating relative to the front wall; and when the mounting portion is engaged with the second securing portion, the mounting member is disengaged from the door, allowing the door to open. An electronic device enclosure with the mounting apparatus is further offered.

17 Claims, 6 Drawing Sheets

MOUNTING APPARATUS AND ELECTRONIC DEVICE ENCLOSURE WITH THE SAME

BACKGROUND

1. Technical Field

The present disclosure relates to mounting apparatuses and electronic device enclosures, more particularly to a mounting apparatus for a door of a data center servers and to an electronic device enclosure with the mounting apparatus.

2. Description of Related Art

Blade and rack-mounted servers are popularly used in data center servers. In order to achieve high performance, many rack-mounted servers may be clustered in an enclosure. A door is defined in the enclosure for the rack-mounted servers to put into or be taken out of the enclosure. However, the door may be accidentally opened when the enclosure is being transported. Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
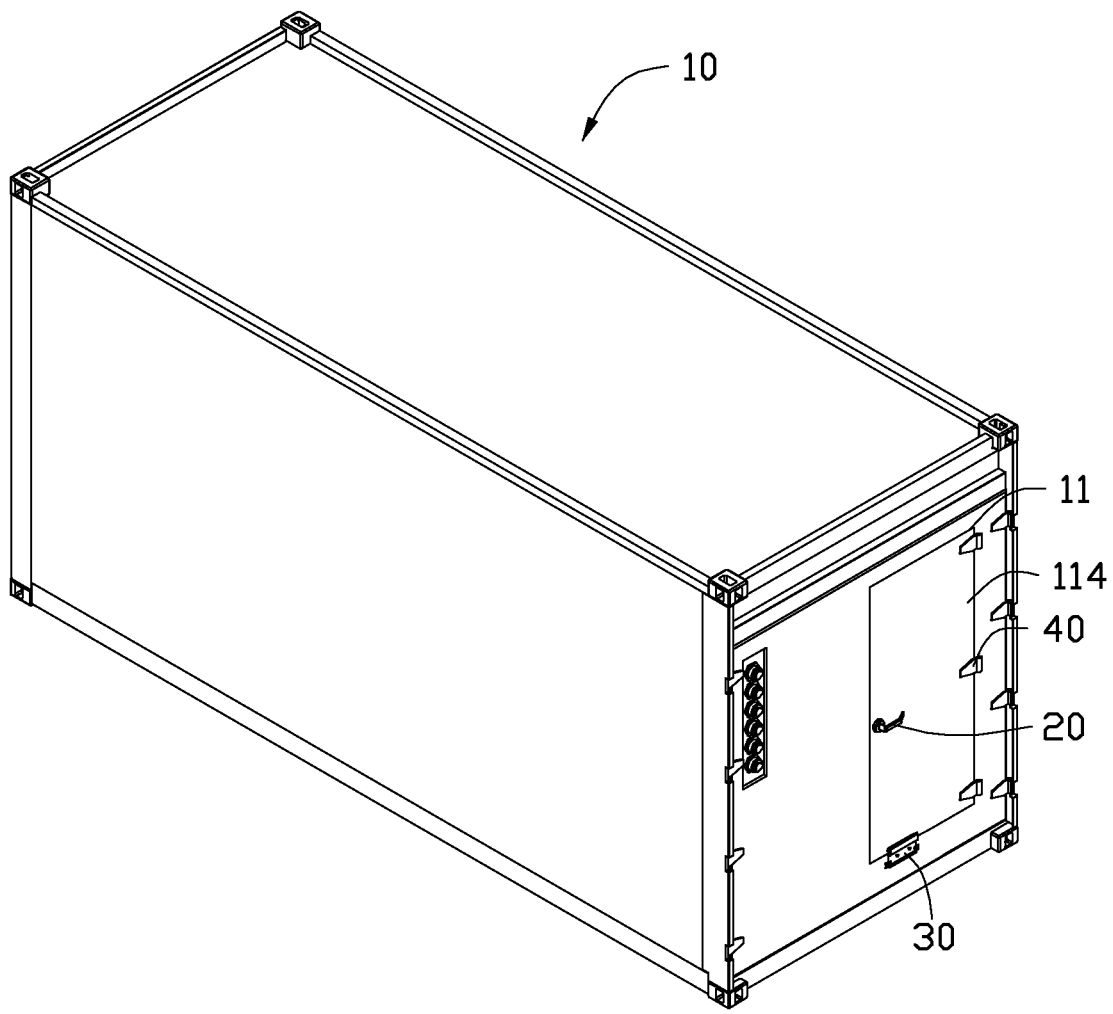
FIG. 1 is an isometric view of a mounting apparatus and an enclosure in accordance with an embodiment.
Figure 2:
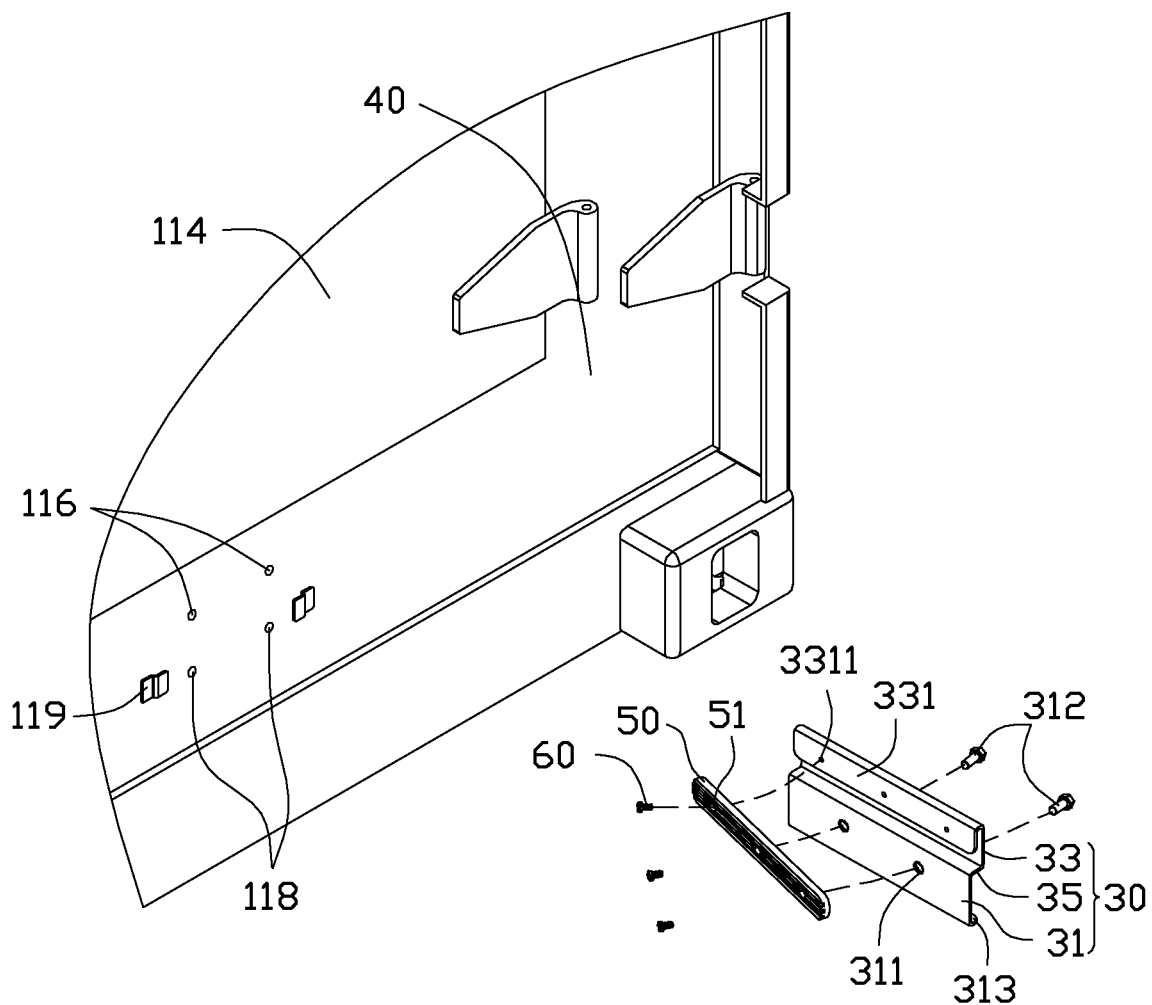
FIG. 2 is an exploded, cut-away view of FIG. 1.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

FIGS. 1-4 show a mounting apparatus in accordance with an embodiment. The mounting apparatus is attached to an enclosure 10. In one embodiment, the enclosure 10 is a container for receiving blade and rack-mounted servers.

The enclosure 10 includes a front wall 11. The front wall 11 defines an opening 112 (shown in FIG. 4) for blade and rack-mounted servers to be put in or taken out of the enclosure 10. A door 114 is rotatably secured to the front wall 11 by a plurality of rotatable members 40. The door 114 includes a lock 20 to lock the door 114 on the front wall 11. Two first securing portions 116 and two second securing portions 118 are defined in the front wall 11 below the opening 112. The two first securing portions 116 and the two second securing portions 118 are holes. In one embodiment, the present disclosure is not limited to such a configuration and the positions, which can be changed according to other known techniques to allow movement of the two first securing portions 116 and the two second securing portions 118; for example, the two first securing portions 116 and the two second securing portions 118 are hook-shaped. The two first securing portions 116 are arranged at a first straight line, and the two second securing portion 118 are arranged at a second straight line that is substantially parallel to the first straight line. The front wall 11 further comprises a step 117 below the two securing holes 116.

The mounting apparatus comprises two sliding rails 119 attached to the enclosure 10 and a mounting member 30. Each of the two sliding rails 119 comprises a positioning panel 1191 secured to the enclosure 10 and a guiding panel 1193 extending from the positioning panel 1191. A sliding way 1195 is defined between the guiding panel 1193 and the front wall 11.

The mounting member 30 includes a first mounting panel 31, a second mounting panel 33, and a connecting panel 35 connected to the first mounting panel 31 and the second mounting panel 33. In one embodiment, the connecting panel 35 is substantially perpendicular to the first mounting panel 31 and the second mounting panel 33, the first mounting panel 31 is substantially parallel to the connecting panel 35, and an extending direction of the first mounting panel 31 is opposite to that of the second mounting panel 33.

The first mounting panel 31 defines two mounting holes 311 for receiving two mounting portions 312. A flange 313 extends from a bottom edge of the first mounting panel 31. The flange 313 is substantially perpendicular to the first mounting panel 31, and the two mounting portions 312 are screws. In one embodiment, the two mounting portions 312 are clipping portions to engage with the first securing portions 116 or the two second securing portions 118.

An extending panel 331 extends from a top edge of the second mounting panel 33, and three positioning holes 3311 are defined in the extending panel 331. In one embodiment, the extending panel 331 is substantially parallel to the second mounting panel 33, and an extending direction of the extending panel 331 is same as the extending direction of the second mounting panel 33.

A vibration-absorbing member 50 is attached to the second mounting panel 33. Three through holes 51 are defined in the vibration-absorbing member 50 and corresponding to the three positioning holes 3311. Three fixing members 60, such as screws, are inserted into the three positioning holes 3311 and the three through holes 51, to mount the vibration-absorbing member 50 to the second mounting panel 33. In one embodiment, the vibration-absorbing member 50 is plastic.

Figure 6:
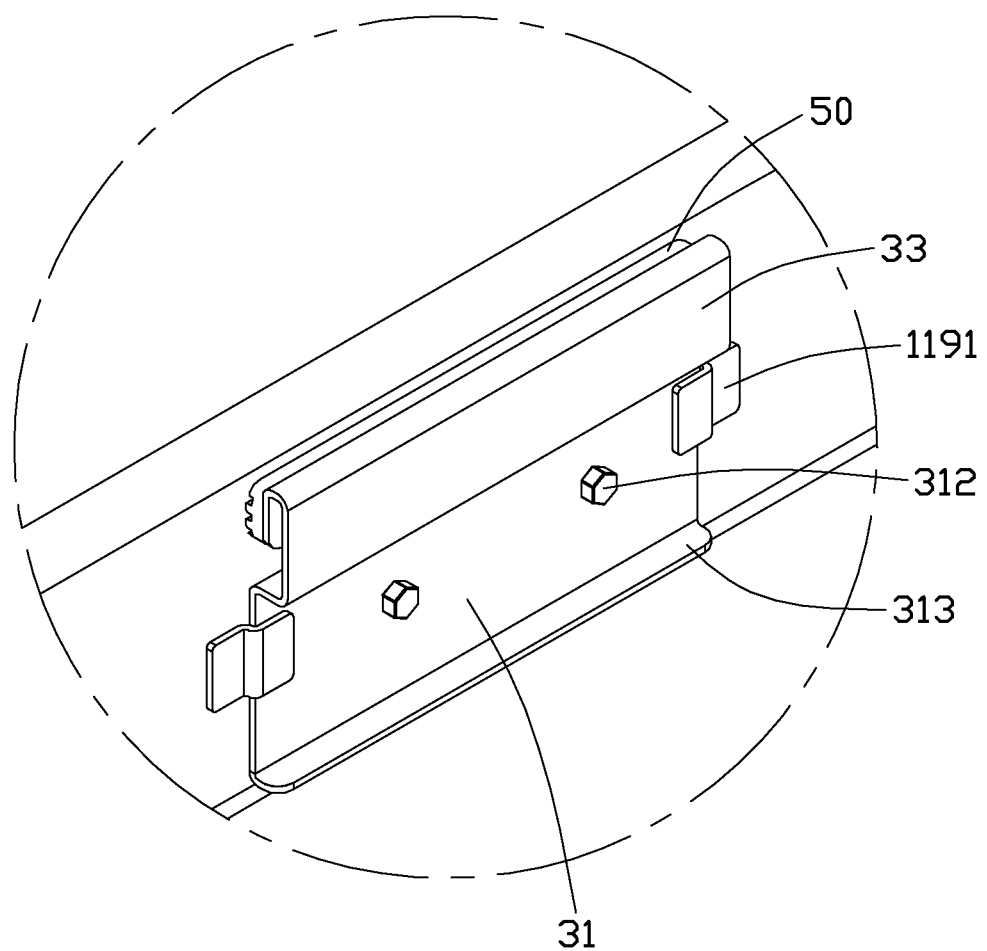
FIG. 6 is an enlarged view of a circled portion VI of FIG. 5.

The mounting member 30 can be positioned in a first position (shown in FIG. 4) or in a second position (shown in FIG. 6). When the mounting member 30 is located in the first position, the two mounting portions 312 are secured to the two first securing portions 116, the second mounting panel 33 abuts the door 114 for preventing the door 114 from rotating relative to the front wall 11. When the mounting member 30 is located in the second position, the two mounting portions 312 are secured to the two second securing portions 118, the second mounting panel 33 is disengaged from the door 114 for allowing the door 114 rotating relative to the front wall 11.

Figure 3:
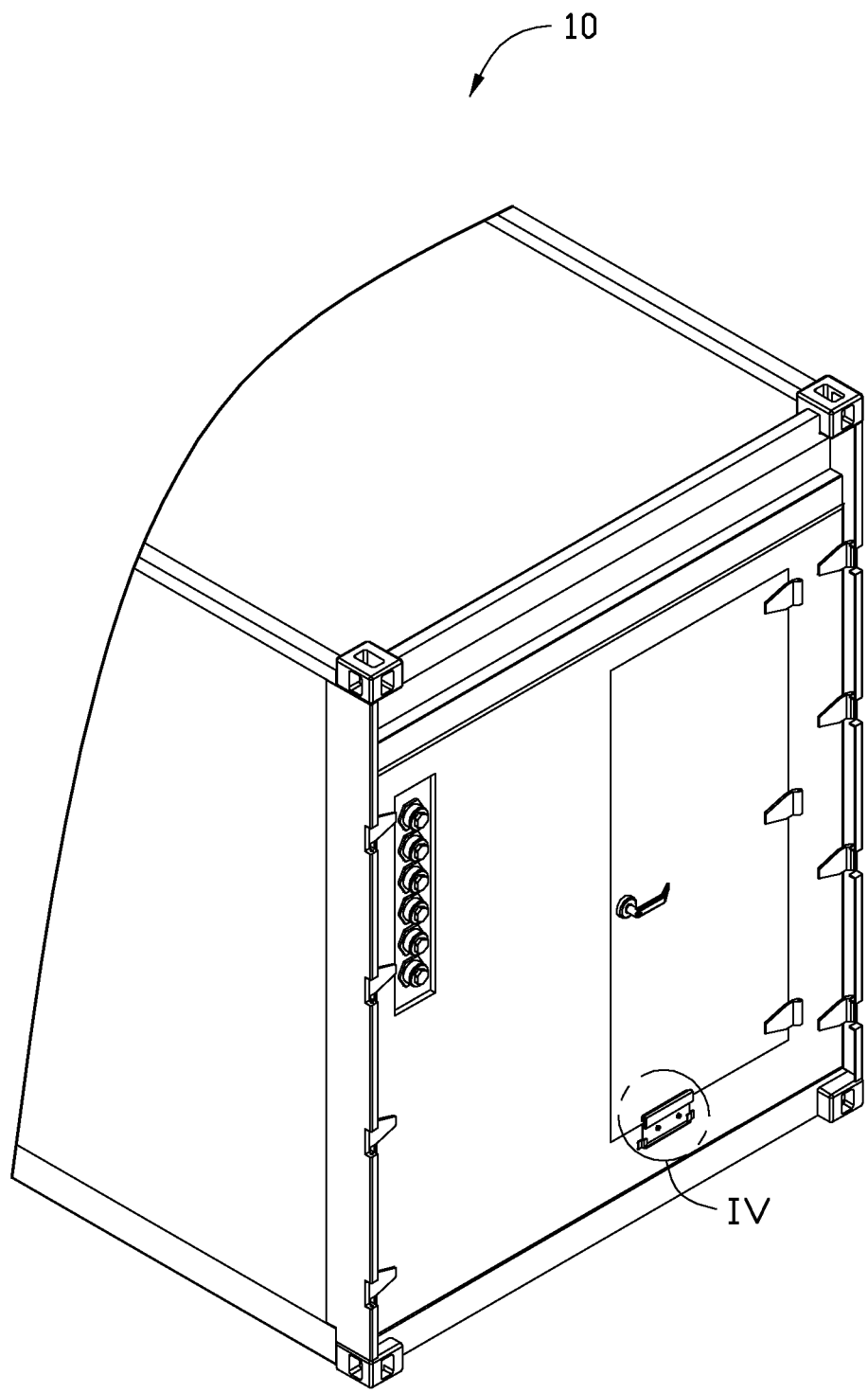
FIG. 3 is an assembled view of FIG. 2, and a mounting member of the mounting apparatus is located in a first position.
Figure 4:
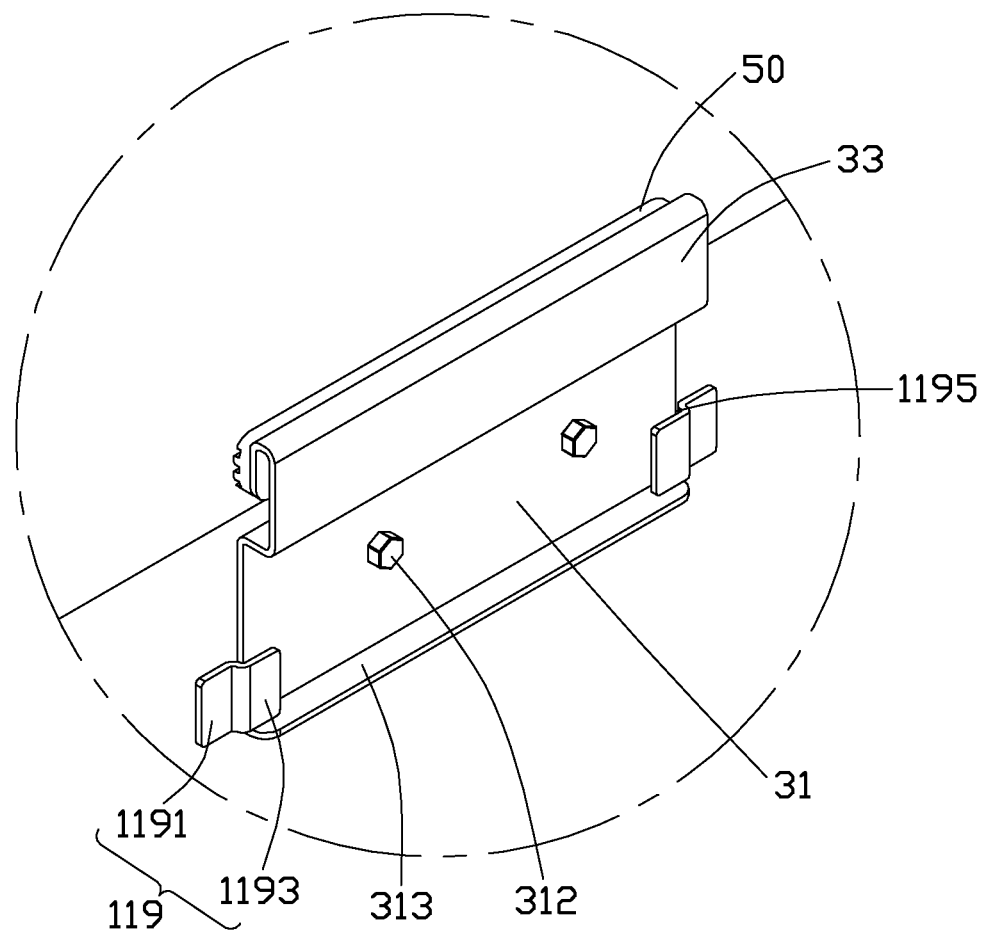
FIG. 4 is an enlarged view of a circled portion IV of FIG. 3.

Referring to FIGS. 3-4, when the enclosure 10 is transported, the door 114 is locked to the front wall 11. The first mounting panel 31 is slidably received in the sliding way 1195. The second securing panel 33 abuts the front wall 11 and the door 114. The two mounting portions 312 are engaged in the two mounting holes 311 and the two first securing portion 116, to secure the two mounting portions 312 to the first securing portions 116. The mounting member 30 is located in the first position, the second mounting panel 33 is above the first mounting panel 31. The second mounting panel 33 with the vibration-absorbing member 50 abuts the front wall 11, to prevent the door 114 from disengaging from the front wall 11.

Figure 5:
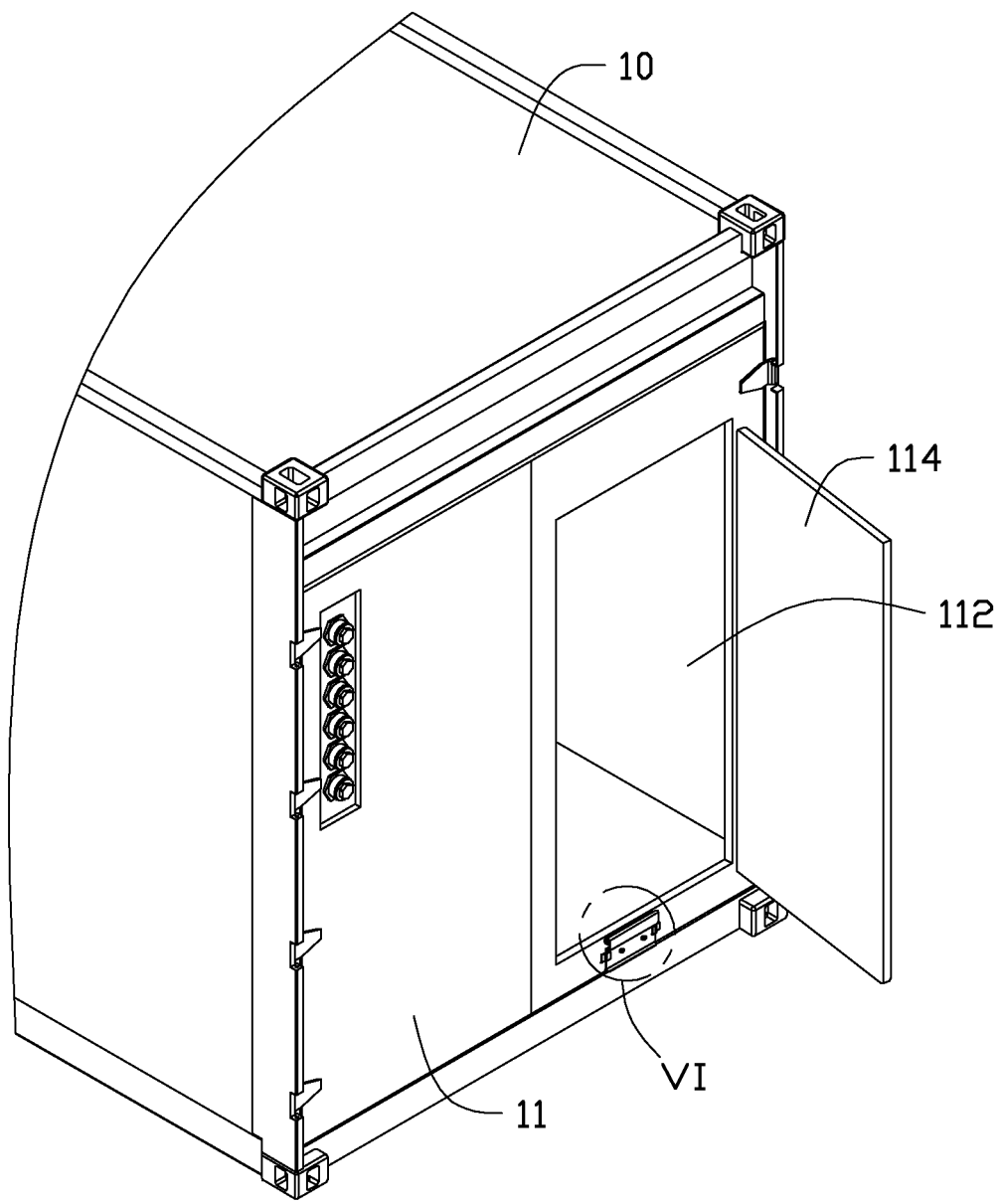
FIG. 5 is similar to FIG. 3, and the mounting member is located in a second position.

Referring to FIGS. 5-6, when the door 114 needs to be opened. The two mounting portions 312 are removed from the mounting member 30 and the door 114. The mounting member 30 slides down to disengage the second mounting panel 33 from the door 114. When the two mounting portions 312 are aligned with the two securing portions 118, the two mounting portions 312 are engaged with the two securing portions 118, to secure the mounting member 30 to the front wall. Thus, the door 114 can be opened.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus configured for being secured to a front wall of an enclosure, a door rotatably attached to the front wall; the front wall comprising a first securing portion and a second securing portion, the mounting apparatus comprising:
    a sliding rail attached to a front wall of an enclosure; and
    a mounting member slidably attached to the sliding rail; the mounting member comprises at least one mounting portion to engage with a first securing portion or a second securing portion of the front wall;
    wherein when the mounting portion is engaged with the first securing portion, the mounting member is engaged with the door, and the mounting member is configured to prevent the door from rotating relative to the front wall; and when the mounting portion is engaged with the second securing portion, the mounting member is disengaged from the door.

2. The mounting apparatus of claim 1, wherein the mounting member comprises a first mounting panel and a second mounting panel connected to the first mounting panel, the first mounting panel is slidably attached to the sliding rail, and the second mounting panel comprises an extending panel, the extending panel is configured to block the front wall.

3. The mounting apparatus of claim 2, the mounting member further comprises a vibration-absorbing member, and the vibration-absorbing member is attached to the extending panel.

4. The mounting apparatus of claim 2, wherein the mounting member further comprises a connecting panel connected to the first mounting panel and the second mounting panel, and the connecting panel is substantially perpendicular to the first mounting panel and the second mounting panel.

5. The mounting apparatus of claim 4, wherein the first mounting panel extends from a bottom edge of the connecting panel, and the second mounting panel extends from a top edge of the connecting panel.

6. The mounting apparatus of claim 1, wherein the at least one mounting portion is configured to engage with a hole of the first securing portion or a hole of the second securing portion.

7. The mounting apparatus of claim 1, wherein the sliding rail comprises a positioning panel configured for attaching to the front wall and a guiding panel connected to the positioning panel, and a sliding way is defined between the guiding panel and the front wall.

8. An electronic device enclosure comprising:
    an enclosure comprising a front wall and a door rotatably attached to the front wall; the front wall comprising a first securing portion and a second securing portion below the first securing portion;
    a sliding rail attached to the front wall;
    a mounting member slidably attached to the sliding rail; and
    a mounting portion moveably attached to the mounting member;
    wherein the mounting portion is moveable to a first position or a second position, when the mounting portion is in the first position, the mounting portion is engage with the first securing portion, and the mounting member abuts the door, when the mounting portion is in the second position, the mounting portion is engage with the second securing portion, and the mounting member is disengaged from the door.

9. The electronic device enclosure of claim 8, wherein the mounting member comprises a first mounting panel and a second mounting panel connected o the first mounting panel, the first mounting panel is slidably attached to the sliding rail, and the second mounting panel comprises an extending panel, the extending panel is configured to block the front wall.

10. The electronic device enclosure of claim 9, wherein the mounting member further comprises a vibration-absorbing member, and the vibration-absorbing member is attached to the extending panel.

11. The electronic device enclosure of claim 9, wherein the mounting member further comprises a connecting panel connected to the first mounting panel and the second mounting panel, and the connecting panel is substantially perpendicular to the first mounting panel and the second mounting panel.

12. The electronic device enclosure of claim 11, wherein the first mounting panel extends from a bottom edge of the connecting panel, and the second mounting panel extends from a top edge of the connecting panel.

13. The electronic device enclosure of claim 8, wherein a configuration of the first securing portion is the same as a configuration of the second securing portion.

14. The electronic device enclosure of claim 13, wherein each of the first securing portion and the second securing portion defines a hole, the mounting portion is configured to engage with the hole.

15. The electronic device enclosure of claim 8, wherein the sliding rail comprises a positioning panel configured for attaching to the front wall and a guiding panel connected to the positioning panel, and a sliding way is defined between the guiding panel and the front wall.

16. The electronic device enclosure of claim 8, wherein the mounting portion is a screw detachably attached to the mounting member.

17. The electronic device enclosure of claim 8, wherein the mounting portion is a hook attached to the mounting member.

* * * * *